(12) United States Patent
Hirayanagi et al.

(10) Patent No.: US 8,536,539 B2
(45) Date of Patent: Sep. 17, 2013

(54) ION BEAM GENERATOR, AND SUBSTRATE PROCESSING APPARATUS AND PRODUCTION METHOD OF ELECTRONIC DEVICE USING THE ION BEAM GENERATOR

(75) Inventors: Hirohisa Hirayanagi, Kawasaki (JP);
Ayumu Miyoshi, Kawasaki (JP);
Einstein Noel Abarra, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 259 days.

(21) Appl. No.: 12/956,086

(22) Filed: Nov. 30, 2010

(65) Prior Publication Data
US 2011/0147200 A1    Jun. 23, 2011

(30) Foreign Application Priority Data
Dec. 18, 2009    (JP) ................................ 2009-287082

(51) Int. Cl.
*G21K 5/04*    (2006.01)
(52) U.S. Cl.
USPC ................. 250/423 R; 250/492.1; 250/492.3; 250/396 R; 315/111.01
(58) Field of Classification Search
USPC ........ 250/423 R, 424, 492.1, 492.21, 492.22, 250/492.3, 396 R, 397; 315/111.01, 111.21, 315/111.31, 111.61, 111.81, 111.91
See application file for complete search history.

(56) References Cited

U.S. PATENT DOCUMENTS

| 4,925,755 | A | * | 5/1990 | Yamaguchi et al. ............... 430/5 |
| 5,902,462 | A | * | 5/1999 | Krauss ..................... 204/192.38 |
| 2002/0186815 | A1 | * | 12/2002 | McGeoch ...................... 378/119 |
| 2004/0221815 | A1 | * | 11/2004 | Fukuda et al. ............... 118/723 I |
| 2008/0087631 | A1 | | 4/2008 | Hattori et al. | |

FOREIGN PATENT DOCUMENTS

| JP | 60-127732 A | 7/1985 |
| JP | 2008-117753 A | 5/2008 |

OTHER PUBLICATIONS

Lee, Robert E. "Microfabrication by ion-beam etching," J. Vac. Sci. Technol. 16(2), Mar./Apr. 1979. pp. 164-170.

* cited by examiner

*Primary Examiner* — Nicole Ippolito
(74) *Attorney, Agent, or Firm* — Fitzpatrick, Cella, Harper & Scinto

(57) ABSTRACT

An ion beam generator includes a discharge tank for generating plasma that includes ions. A lead-out electrode has an annular grid portion provided with openings for leading out the ions generated in the discharge tank, while accelerating the generated ions as an annular ion beam. A deflecting electrode deflects the annular ion beam, which is led out of the lead-out electrode, in an annular center direction.

7 Claims, 13 Drawing Sheets

ION BEAM GENERATOR, AND SUBSTRATE PROCESSING APPARATUS AND PRODUCTION METHOD OF ELECTRONIC DEVICE USING THE ION BEAM GENERATOR

CLAIM OF PRIORITY

This application claims the benefit of Japanese Patent Application No. 2009-287082, filed Dec. 18, 2009, which is hereby incorporated by reference herein in its entirety.

FIELD OF THE INVENTION

The present invention relates to an ion beam generator for performing high-precision and uniform microfabrication and planarization processing of a surface for microfabrication of a semiconductor substrate and a magnetic disk substrate, a substrate processing apparatus using the above generator, and a method of producing an electronic device by using the generator.

BACKGROUND OF THE INVENTION

A substrate processing apparatus provided with an ion beam generator is available as a technology for performing high-precision and uniform microfabrication and planarization processing of a surface for microfabrication of a semiconductor substrate and a magnetic disk substrate. Published Japanese Patent Application No. JP-A S60-127732 discloses a semiconductor processing apparatus that has an accelerating grid disposed obliquely relative to the surface of a semiconductor in order to perform high-precision surface processing. And, Published Japanese Patent Application No. JP-A 2008-117753 discloses an ion gun in which a lead-out electrode portion is disposed obliquely at both sides of a reference plane, and both sides of a substrate are planarized simultaneously.

BRIEF SUMMARY OF THE INVENTION

In an ion beam generator, a lead-out electrode generally has plural apertures through which ions are lead out, and an ion beam just lead out from the lead-out electrode is naturally in a nonuniform state having denseness and sparseness in correspondence with the presence, and not of the apertures. But, since the ion beam spreads gradually, peripherally, before reaching the substrate, the ion beam is irradiated uniformly to the substrate when a distance from the lead-out electrode to the substrate is long enough. The above-described prior art is an apparatus that causes the ion beam to enter obliquely to the substrate, but since the size of the entire apparatus is restricted, the distance from the lead-out electrode to the substrate cannot be assured sufficiently. In other words, there is a problem that the ion beam incident on the substrate cannot be made sufficiently uniform. Therefore, the number of apertures formed in the lead-out electrode is increased, and a pitch of apertures is narrowed, to make the ion beam uniform. This, however, is still insufficient.

A subject of the present invention is to provide a uniform incident ion beam on the substrate in the ion beam generator, without increasing the size of the whole apparatus. In addition, the present invention has another subject to provide a substrate processing apparatus, which is provided with the above ion beam generator and is capable of performing uniform etching processing, and a production method of an electronic device including a uniform etching process using the above ion beam generator.

A first aspect of the present invention is an ion beam generator that includes a discharge tank for generating plasma, a lead-out electrode having an annular grid portion provided with openings for leading out the ions generated in the discharge tank, while accelerating them, and a deflecting electrode for deflecting an annular ion beam, which is lead out of the lead-out electrode, in the annular center direction.

A second aspect of the present invention is a substrate processing apparatus that includes a substrate holder for holding a substrate, and ion beam generators disposed to face both surfaces of the substrate held by the substrate holder, wherein the ion beam generators are those according to the present invention.

A third aspect of the present invention is a method of producing an electronic device using the ion beam generator according to the present invention. The method includes generating plasma within the discharge tank, leading out an ion beam from the plasma within the discharge tank by applying a voltage to the lead-out electrode, deflecting the ion beam by applying a voltage to the deflecting electrode, and etching the surface of the substrate by the deflected ion beam.

In the ion beam generator of the present invention, the ion beam lead out from the lead-out electrode is deflected by the deflecting electrode, so that the route of the ion beam from the lead-out electrode to the substrate can be provided sufficiently. Therefore, the substrate can be processed by a uniform ion beam without increasing the number of apertures in the lead-out electrode, narrowing the pitch of the apertures, or increasing the size of the apparatus.

An electronic device can be produced with a good yield by performing uniform etching using the ion beam generator of the present invention.

DETAILED DESCRIPTION OF THE INVENTION

Embodiments of the present invention are described below with reference to the drawings, but the present invention is not limited to the embodiments.

Figure 1:
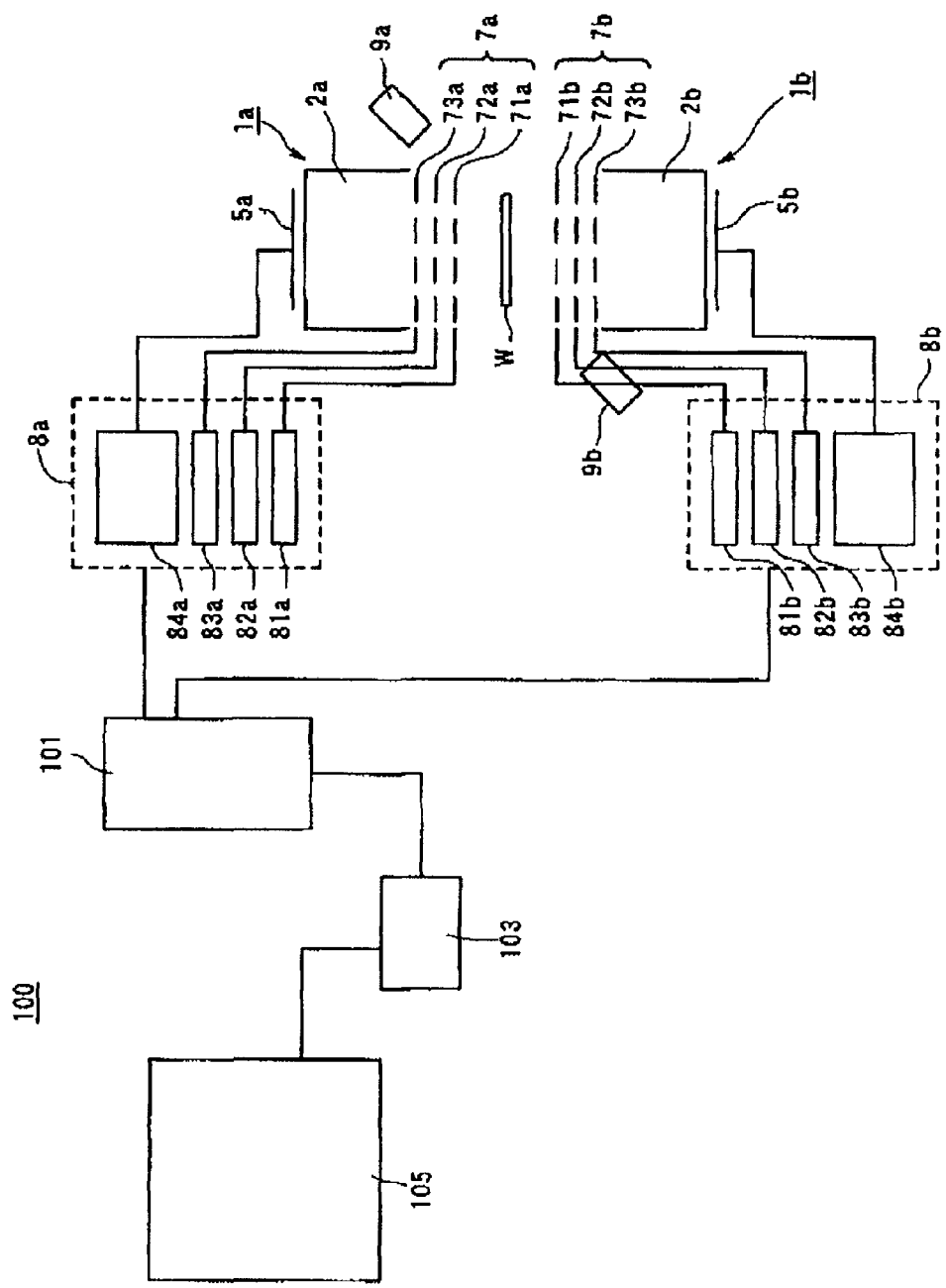
FIG. 1 is a schematic view illustrating the whole structure of one embodiment of a substrate processing apparatus of the present invention.

A substrate processing apparatus of the present invention is described below with reference to FIG. 1. FIG. 1 is a schematic view showing a structure of the apparatus of this embodiment viewed from above. As shown in FIG. 1, a substrate processing apparatus 100 is provided with a substrate (wafer) W, first and second ion beam generators 1a and 1b, which are arranged to face each other with the substrate W between them, a control unit 101, a counter 103, and a computer interface 105.

Figure 2:
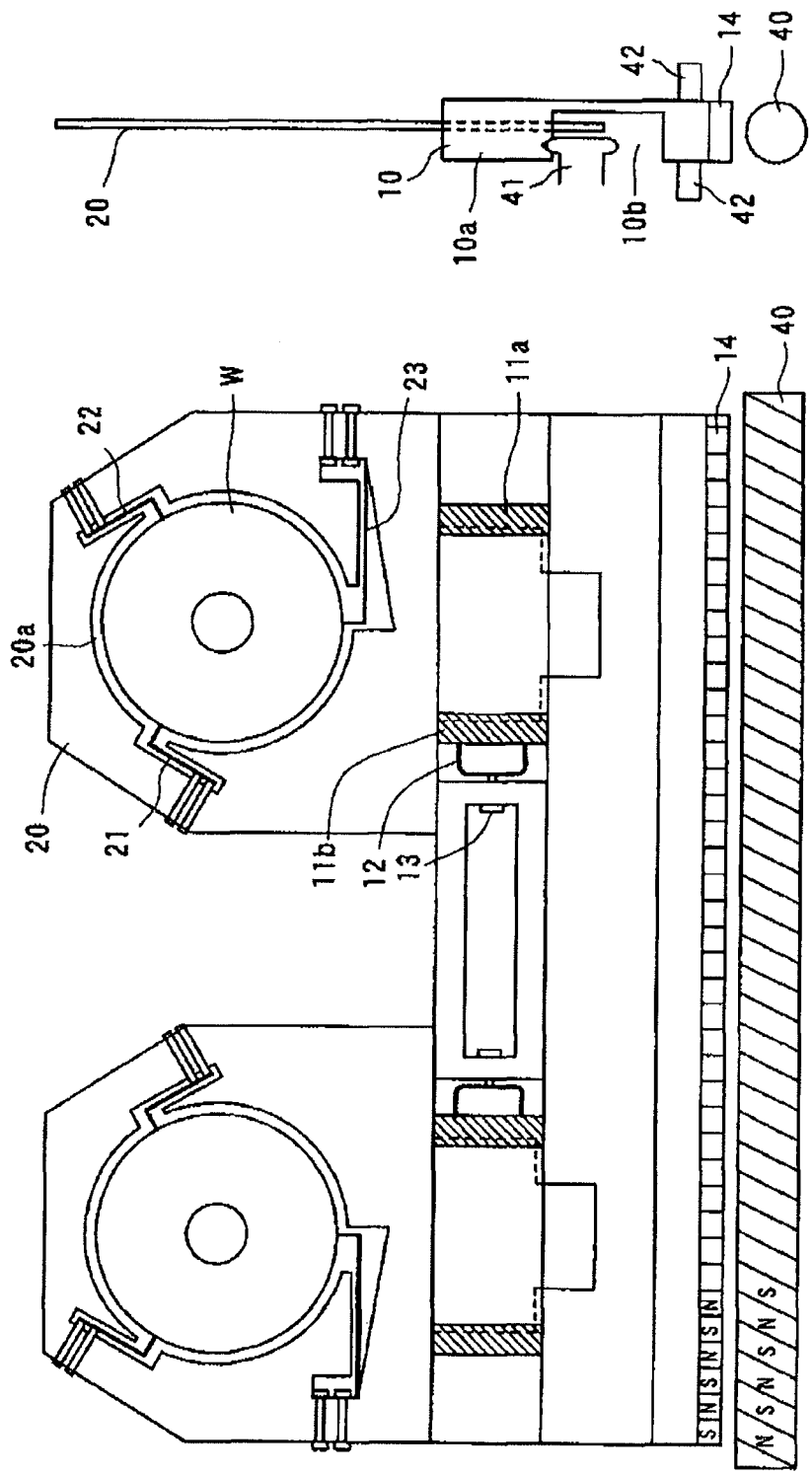
FIG. 2A and FIG. 2B are views showing a configuration example of a carrier for holding a substrate in the apparatus of FIG. 1.

The substrate W of this embodiment is, for example, a substrate for a magnetic recording medium, such as a hard disk, and generally has an opening at the center of a substantially disk-shaped substrate. The substrate W is held in a posture erected in a vertical direction by, for example, a substrate carrier (conveying apparatus) shown in FIG. 2A and FIG. 2B. The substrate processing apparatus of the present invention is used not only for both side processing of the substrate for a magnetic recording medium, such as a hard disk, but can also be used for one-side processing. As shown in FIG. 1, since it is difficult to provide a mechanism for rotating the substrate to an in-line conveying apparatus for both sides processing, because the space for the apparatus is limited, it is more effective to use the present invention.

One configuration example of the substrate carrier is described below with reference to FIG. 2A and FIG. 2B. FIG. 2A and FIG. 2B are a front view and a side view schematically showing a structure of the carrier. As shown in FIG. 2A and FIG. 2B, the carrier is comprised of two substrate holders 20 and a slider member 10, which holds the substrate holders 20 in a vertical direction (vertically) and moves along a conveying path. Lightweight Al (A5052), or the like, is generally used for the slider member and the substrate holders.

Each substrate holder 20 has, at its center, a circular opening 20a in which the substrate is inserted, and also, has a shape at its lower portion that the width decreases in two stages. Inconel L-shaped spring members 21, 22, and 23 are attached to three positions on the circumference of the opening 20a, and the spring member (movable spring member) 23 is configured to be pushed downward. The spring members 21, 22, and 23 are formed to have at their leading ends a V-shaped groove for holding an outer peripheral end face of the substrate and protrude into the opening 20a. The spring members 21, 22, and 23 are mounted rotationally, symmetrically. And, supporting nails of the two spring members 21 and 22 are arranged at positions symmetrical with respect to a vertical line running through the center of the opening of the substrate holder 20, and the supporting nail of the movable spring member 23 is arranged on the vertical line. By arranging in this way, a force is applied in a direction that the substrate W rotates, and the substrate W can be held more uniformly by the three supporting nails, even if the opening center of the substrate holder 20 and the center of the substrate W mounted are displaced slightly for some reason when the substrate W is mounted on the carrier. The displacement that is increased in the case of thermal expansion can be eliminated. The intermediate portion of the substrate holder 20 has its side end faces held by insulating members 11a and 11b, such as alumina, which are disposed within the slider member 10. And, the tip end portion makes a contact portion with a contact point for applying a substrate bias.

The slider member 10 has a U-shaped cross-sectional shape with a recess portion 10b formed in a middle portion, as shown in FIG. 2B, and an upper thick portion 10a has slit grooves for holding the intermediate portion of the substrate holder 20 formed through the thick portion 10a to reach the recess portion 10b. The pair of insulating members 11a and 11b are disposed at both ends within the slit grooves, the insulating member 11a at the end side of the slider member 10 is fixed within the groove, and the insulating member 11b at the center of the slider member 10 is arranged to be movable horizontally. In addition, a leaf spring 12 is mounted to push the movable insulating member 11b toward the end side of the slider member 10. Thus, the substrate holder 20 is inserted in the grooves of the slider member 10, and a screw 13 is tightened to push the substrate holder 20 toward the exterior of the carrier so as to firmly fix it.

Multiple magnets 14 are attached to the bottom of the slider member 10 with their magnetization directions alternately reversed, and the slider member 10 is moved by the interaction with a rotating magnet 40 that is arranged along a conveying path. Guide rollers 41 for preventing the slider from separating from the conveying path and rollers 42 for preventing the slider member 10 from falling are mounted to the conveying path, at prescribed intervals.

Referring back to FIG. 1, the first ion beam generator 1a and the second ion beam generator 1b are disposed to face each other with the substrate W held therebetween, so as to face both sides of the substrate W. In other words, the first ion beam generator 1a and the second ion beam generator 1b each are arranged to irradiate the region therebetween with an ion beam, and the substrate carrier, which holds the substrate W having an opening, is disposed in the same region. According to the structure shown in FIG. 1, the ion beam irradiation surfaces of the first and second ion beam generators 1a and 1b and the to-be-processed surfaces of the substrate W are disposed substantially parallel to each other.

The first ion beam generator 1a is provided with an electrode 5a, a discharge tank 2a for generating plasma, and a lead-out electrode 7a (electrodes 71a, 72a, and 73a from the substrate) as mechanisms for lead-out of ions from the plasma. The electrodes 71a, 72a, and 73a are connected with voltage sources 8a (81a, 82a, and 83a from the substrate) so as to be controllable independently. A neutralizer 9a is disposed close to the lead-out electrode 7a. The neutralizer 9a is configured such that the electrons can be irradiated to neutralize the ion beam irradiated by the ion beam generator 1a.

The discharge tank is supplied with a processing gas, such as argon (Ar), by a gas introduction means, not shown. The discharge tank 2a is supplied with Ar by the gas introduction means, and RF (radio-frequency wave) power is applied from an RF source 84a to the electrode 5a to generate the plasma. Ions are lead out from the plasma by the lead-out electrode 7a to perform etching of the substrate W.

Since the second ion beam generator 1b is also configured in the same manner as that of the above-described ion beam generator 1a, its description is omitted.

The control unit 101 is electrically connected with the voltage source 8a of the ion beam generator 1a and a voltage source 8b of the ion beam generator 1b, and controls the voltage sources 8a and 8b. The counter 103 is connected with the control unit 101 and configured such that it can instruct the control unit 101 to start a cleaning treatment when it counts the number of substrates treated by the ion beam generators 1a and 1b, until it reaches a specified number (e.g., one thousand substrates). Especially, the control unit 101 has a program memory for storing programs (software) for performing overall control of an ion beam etching processing and a substrate conveying operation, and overall control of various added functions. The central processing unit (CPU) of a microcomputer reads sequentially required programs from the program memory and executes them. And, various types of storage media, such as a hard disk, an optical disk, a flash memory, etc., can be used for storage management of the programs.

The computer interface 105 is connected with the control unit 101 and the counter 103, and is configured such that the apparatus user can input cleaning conditions (such as processing time).

Figure 3:
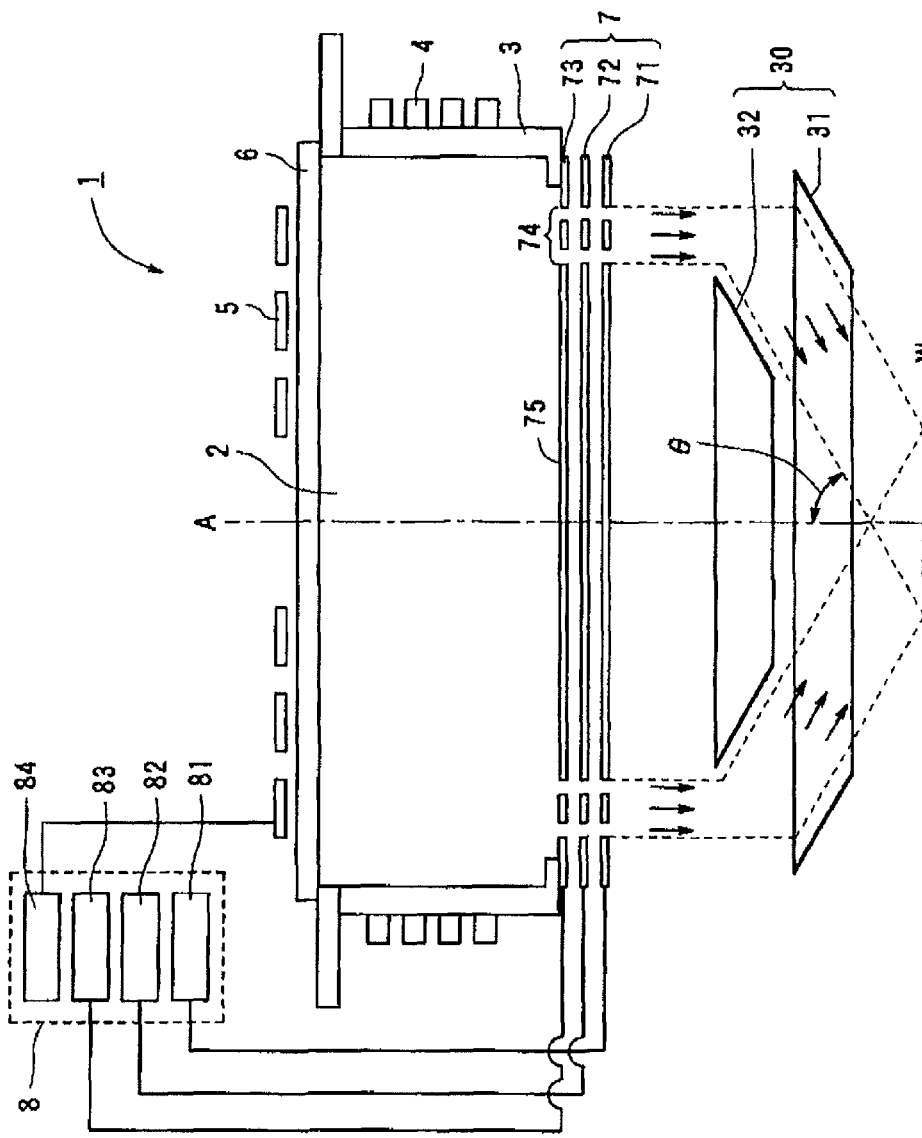
FIG. 3 is a schematic sectional view showing in detail an ion beam generator of the substrate processing apparatus of FIG. 1.
Figure 4A:
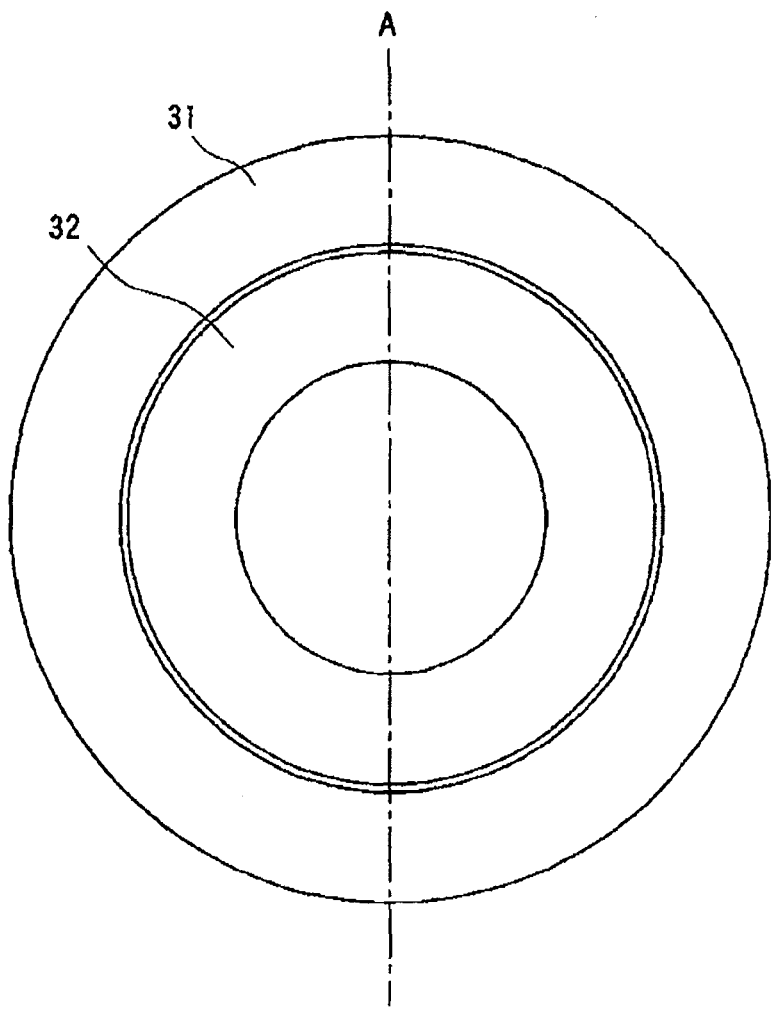
FIG. 4A and FIG. 4B are views illustrating a detailed structure of a deflecting electrode.
Figure 4B:
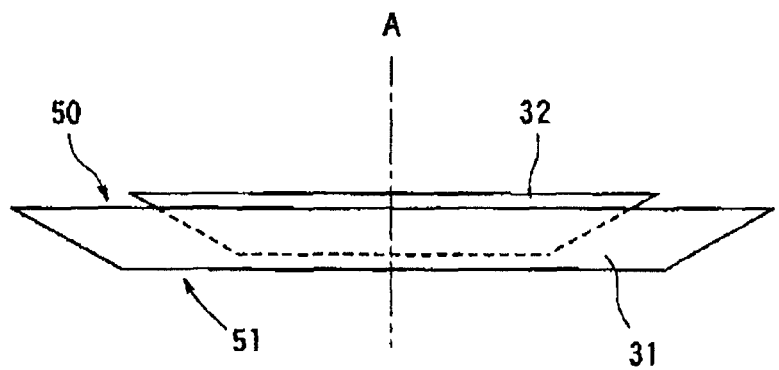

Referring to FIG. 3, FIG. 4A, and FIG. 4B, an ion beam generator 1 (1a and 1b) is described below in detail.

FIG. 3 is a schematic sectional view showing a detailed structure of one embodiment of the ion beam generator according to the present invention. Since the first and second ion beam generators 1a and 1b have the same structure, the following description is made with the branch marks a and b omitted appropriately.

As shown in FIG. 3, the ion beam generator 1 has a discharge tank 2 for confining the plasma. The pressure of the discharge tank 2 is generally kept in a range of about $1 \times 10^{-4}$ Pa ($1 \times 10^{-5}$ mbar) to about $1 \times 10^{-2}$ Pa ($1 \times 10^{-3}$ mbar). The discharge tank 2 is defined by a plasma confining container 3 and is provided with a multipole magnetic means 4, which traps the ions to be discharged within the discharge tank 2, resulting from the formation of plasma, around it. This magnetic means 4 is generally provided with multiple bar permanent magnets. Multiple relatively long bar magnets whose polarities are changed alternately may also be used to configure it so that an N and S cycle generates along only one axis. And, it may also have a checkerboard structure that shorter magnets are arranged such that the N and S cycle spreads on a plane formed by two mutually orthogonal axes.

RF power is applied to the back wall of the plasma confining container 3 by RF coil means 5 and is supplied to the discharge tank 2 via a dielectric RF power coupling window 6 to generate plasma.

As shown in FIG. 3, a lead-out electrode 7 is disposed at the front wall of the plasma confining container 3 to lead out ions from the plasma generated in the discharge tank 2 and to accelerate the ions that appear in an ion beam form from the plasma confining container 3. The ions lead out from a grid portion 74 of the lead-out electrode 7 are bent toward the to-be-processed substrate W by the electrical field formed by a deflecting electrode 30 to enter the substrate at an angle θ. The lead-out electrode 7 has a flat portion 75 that is disposed to face substantially parallel to the substrate W (irradiated surface) and the grid portion 74 that outputs the ions to the outside. The grid portion 74 has a structure that multiple micropores are formed to allow irradiation of the ion beam through them. The incident angle θ is desirably sixty degrees or more. The ion beam apparatus must be made large to enter the ion beam to the substrate at the above angle without using the deflecting electrode 30. Therefore, the ion beam generator of the invention can have a sufficient route for the ion beam from the lead-out electrode to the substrate by using the deflecting electrode to deflect the ion beam that is lead out from the lead-out electrode without making the apparatus large. As a result, the ion beam can be irradiated uniformly to the substrate. In this embodiment, the flat portion 75 does not have a grid portion, but may be configured to have a grid portion, such that the ion beam can also be irradiated from the flat portion 75.

The deflecting electrode 30 comprises a first electrode tube 31 having a circular truncated cone shape, and a second electrode tube 32 having a circular truncated cone shape and a diameter smaller than that of the first electrode tube 31, and they are disposed to overlap mutually. The first electrode tube 31 has a circular truncated cone shape with its top and bottom opened. Similarly, the second electrode tube 32 also has a circular truncated cone shape with its top and bottom opened. These electrode tubes are set to have a different electrical potential to form an electrical field between them.

The ion beam lead out from the lead-out electrode 7 enters between the first electrode tube 31 and the second electrode tube 32, and is deflected toward the substrate W by the electrical field formed between both the electrode tubes, to enter into the substrate W at the inclined angle θ. At this time, a region, where the ions enter at the angle θ, on the to-be-processed surface of the substrate W changes, depending on the range of the grid portion 74 of the lead-out electrode 7 and the position of the deflecting electrode 30, and the angle bent by the deflecting electrode 30. The range of the grid portion 74 can be made narrower as the position of the deflecting electrode 30 is closer to the to-be-processed surface, and the angle of bending the ions is larger.

Since the size of the whole apparatus is restricted, the substrate W and the lead-out electrode 7 are arranged to have a distance of 300 mm or less.

FIG. 4A and FIG. 4B are views illustrating a detailed structure of the deflecting electrode 30. FIG. 4A is a top view and FIG. 4B is a side view, showing that the first electrode tube 31 and the second electrode tube 32 form a circular ring-shape incident region 50 where the ion beam enters from the grid portion 74, and a circular ring-shape irradiation region 51 where the deflected ion beam is irradiated toward the substrate. Thus, the annular ion beam is deflected towards the center of the circular ring, while passing through the gap between the first electrode tube 31 and the second electrode tube 32. And, the disk-shaped substrate W can be uniformly processed by the irradiated ion beam. By entering the annular ion beam to the substrate, uniform substrate processing can be realized without rotating the substrate.

Figure 5A:
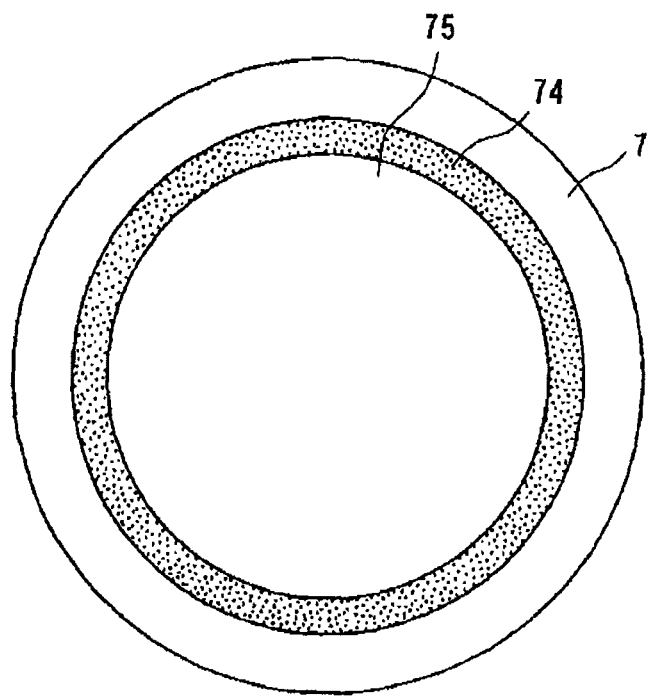
FIG. 5A and FIG. 5B are views showing configuration examples of a grid portion of a lead-out electrode of the ion beam generator of the present invention.
Figure 5B:
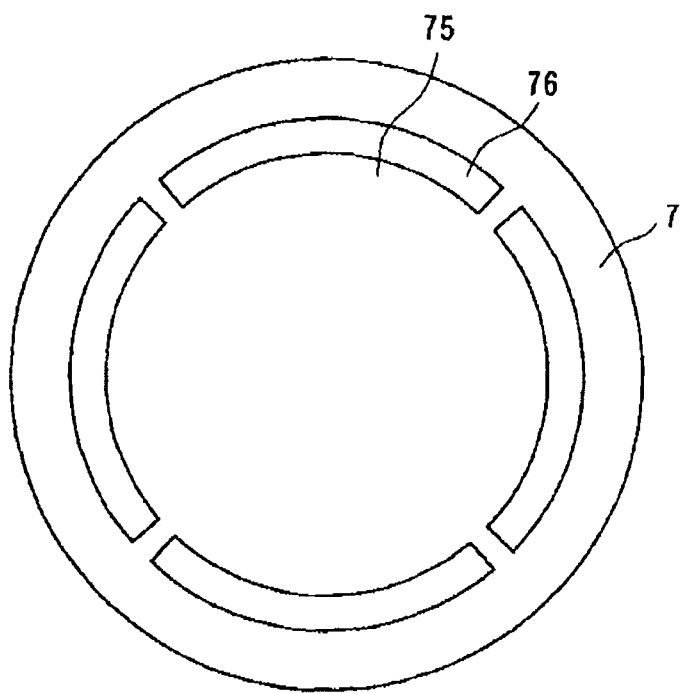

FIG. 5A and FIG. 5B are top views illustrating the surface structure of the lead-out electrode 7. FIG. 5A is an example that the grid portion 74 having circular micropores is disposed in an annular region that is surrounded by two radius circles of the lead-out electrode 7. When the ion output width is narrow, a lead-out electrode, which is provided with multiple arc-shaped linear holes 76, can also be used, as shown in FIG. 5B. When the linear holes are formed, as shown in FIG. 5B, a fabrication time for production can be reduced and the production cost can be reduced substantially as a result. As the material for the lead-out electrode 7, it is common to use Mo in view of a rise in temperature due to heat from the plasma source, resistance to thermal expansion due to the rise in temperature, and securing of rigidity when the thickness is decreased, to secure the lead-out performance of the ion beam. Mo has very high hardness and must be fabricated for a long time. The grid itself must be exchanged periodically, because it is exposed to and worn by the irradiation of ions. By using the linear grid described in this embodiment, the operation time for processing can be reduced substantially, and the cost can be lowered.

In this embodiment, the grid portion was formed into a circular ring shape, but it is not exclusively limited. For example, the grid portion may be formed into a substantially circular ring shape, or a ring shape of a substantially regular polygonal shape, such as a regular octagon shape.

Figure 6A:
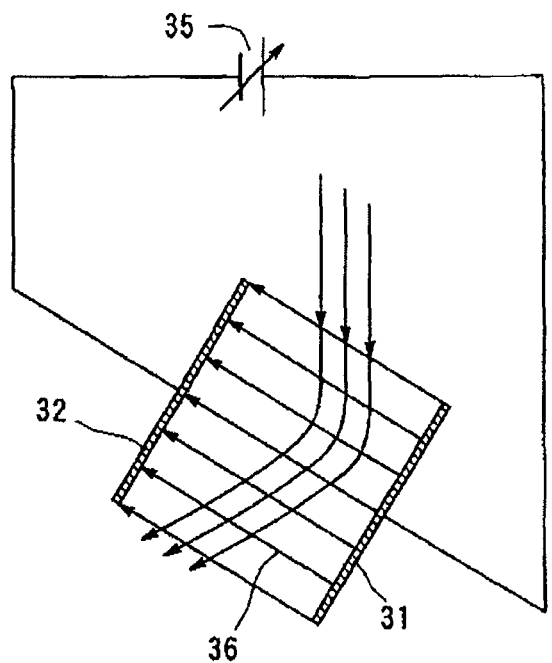
FIG. 6A and FIG. 6B are explanatory views of the action of the deflecting electrode of the ion beam generator of the present invention.
Figure 6B:
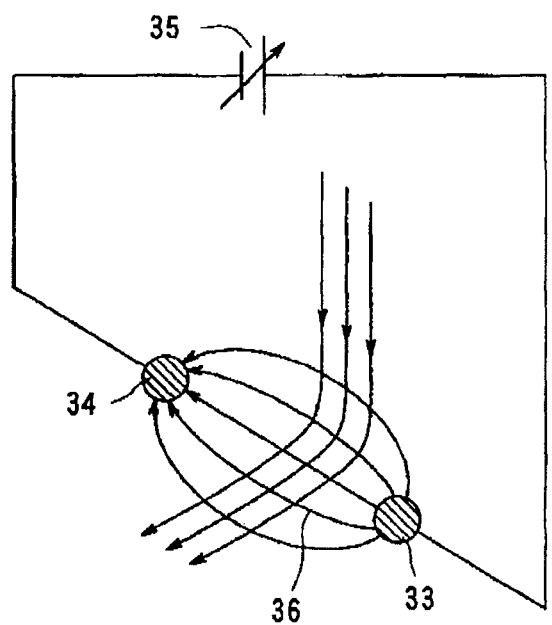

The action of the deflecting electrode 30 is described in detail with reference to FIG. 6A and FIG. 6B. As shown in FIG. 6A, the first electrode tube 31 and the second electrode tube 32, which have a circular truncated cone shape, are arranged to overlap mutually, and an electrical field 36, which is formed by applying a prescribed voltage between them by a DC power source 35, to deflect the ion beam by a prescribed angle. The first electrode tube 31 is applied with a positive electrical potential, and the second electrode tube 32 is applied with a negative electrical potential. A deflection angle can be changed arbitrarily by the electrical field. At this time, it is necessary to arrange such that the electrical field 36, which is generated by the two electrode plates 31 and 32, is formed in a localized style only in the vicinity between the electrodes. For example, the electrical potential of the second electrode tube 32 in FIG. 3 is made the same as the electrical potential of a lead-out electrode 71, so that the electrical field between the lead-out electrode 7 and the deflecting electrode 30 can be made small. According to the present invention, the first electrode tube 31 and the second electrode tube 32 may be a first electrode 33 and a second electrode 34, which have a ring shape, as shown in FIG. 6B.

Figure 7:
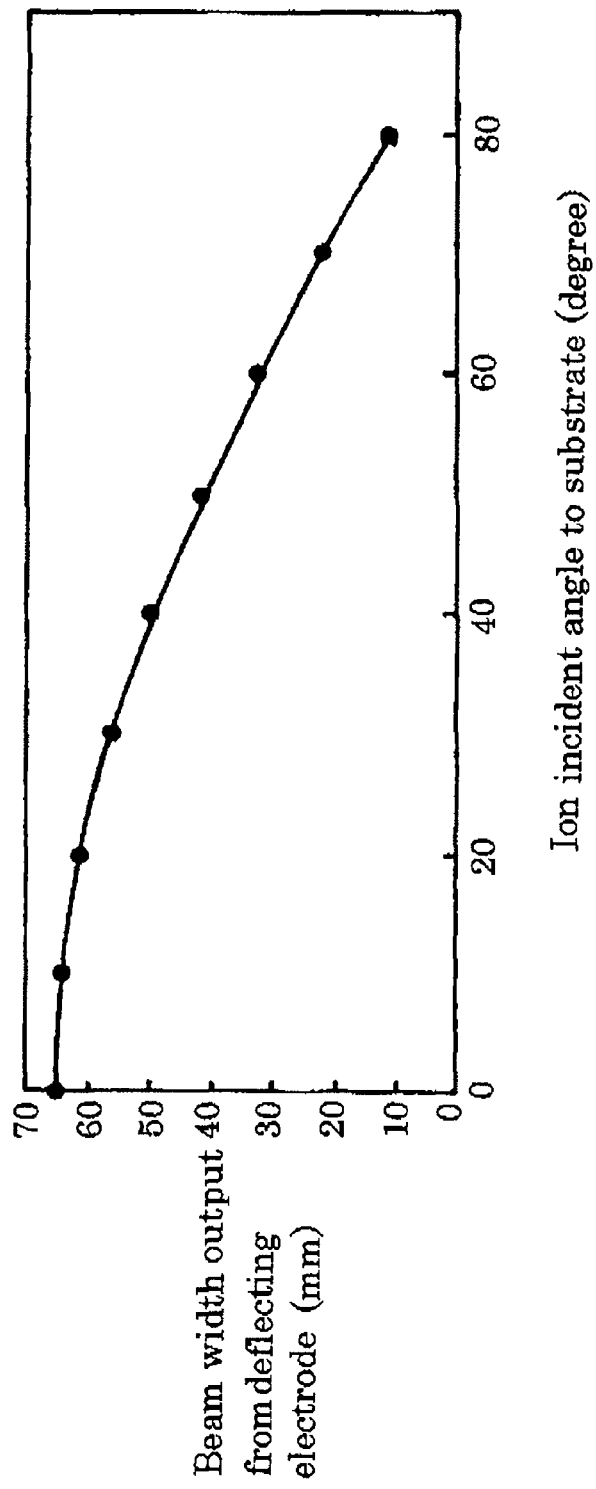
FIG. 7 is a view illustrating a relationship between a beam width and an ion incident angle, which are required to irradiate the ion beam to the whole surface of the substrate to be processed by the ion beam generator of the present invention.

FIG. 7 shows a relationship between an ion beam width and an inclined angle of the ion beam, which is required when ions enter into the whole surface of a 65-mm diameter substrate. To maintain the parallelism of the ion beam, it is desirable that the ion beam width is the same before and after the ion beam is deflected, and the whole surface of the substrate W can be irradiated with the ion beam width in a cross section including the center of the substrate W. Considering the uniformity of the ion beam incident to the substrate W and geometrical displacement due to the mechanical tolerance of the substrate W, the deflecting electrode 30, and the grid portion 74, the width of the grid portion 74 is preferably determined to be not smaller than the value of the output beam width at the ion incident angle to the substrate W, as shown in FIG. 7.

Meanwhile, the irradiation of excessive ions is not desirable in view of the use efficiency of the ion beam, and the width of the grid portion 74 also should be determined considering the uniformity of the beam. For example, when the ion beam enters the substrate W at an incident angle θ of eighty degrees, the width of the beam, which is output from the deflecting electrode 30, has preferably a region slightly larger than 12 mm. And, to realize the planarization by processing the substrate, it is preferable that the incident angle is sixty degrees or more.

By appropriately adjusting the grid portion 74, the position of the deflecting electrode 30 from the to-be-processed surface and the ion beam bending angle, the whole surface of the substrate W can be uniformly irradiated with the ion beam at a prescribed angle θ, as shown in FIG. 3.

Figure 8:
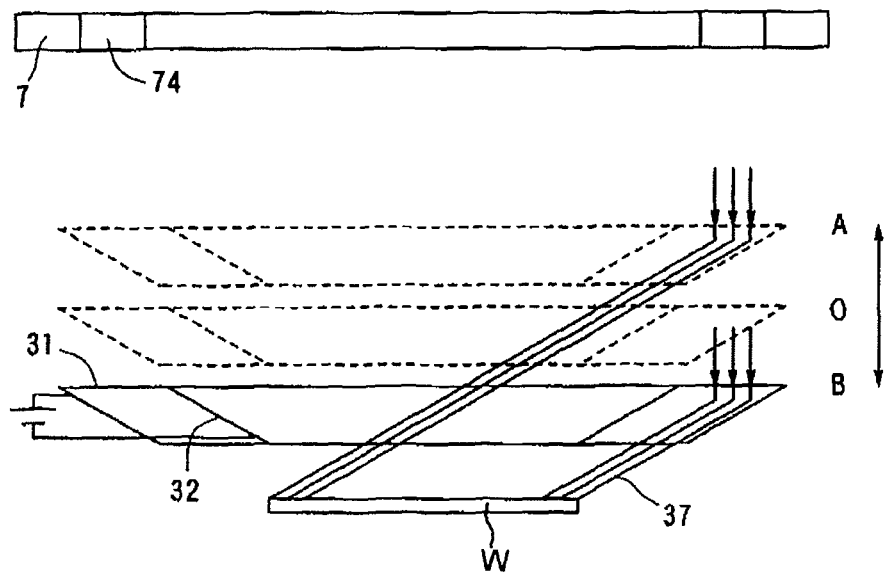
FIG. 8 is a schematic sectional view illustrating a structure to move reciprocally the deflecting electrode in the ion beam generator of FIG. 1.

FIG. 8 shows an embodiment that the deflecting electrode 30 is moved reciprocally. The ion beam generator according to this embodiment is provided with a drive mechanism (not shown) for moving the deflecting electrode 30 in an opposed direction relative to the lead-out electrode 7. The drive mechanism can adjust the position where the ion beam is incident upon the substrate W by moving the deflecting electrode 30 between the lead-out electrode 7 and the substrate W. As shown in FIG. 8, when the deflecting electrode 30 is arranged at a position A close to the lead-out electrode 7, the ion beam 37 enters one end of the substrate W. On the other hand, when the deflecting electrode 30 is arranged at a position B close to the substrate W, the ion beam 37 enters the other end of the substrate W. When the deflecting electrode 30 is arranged at a midpoint O between the point A and the point B, the ion beam mainly enters the center of the substrate W. When the grid portion 74 is made smaller than the width shown in FIG. 7, it occurs occasionally that the ion beam cannot be irradiated to the entire surface of the substrate W to be processed. In such a case, the ion beam can be made to sweep at a prescribed incident angle over the substrate by moving the deflecting electrode 30 between, for example, the to-be-processed substrate surface and the lead-out electrode surface opposed thereto. Thus, the ion beam can be irradiated to the entire surface of the substrate.

When the ion beam is entered in a circular shape to sweep the to-be-processed circular substrate W at a prescribed angle, the incident region has a different area depending on the sweep positions on the to-be-processed substrate W, even if the ion emitting amount from the grid portion 74 is the same. In other words, since the area of the incident region is different between a case that a portion having a small radius on the substrate (position close to the center) is irradiated and a case that the ion beam enters a region having a large radius (position away from the center), the incident amount per unit area is different. As a result, the substrate is not etched uniformly.

Figure 9:
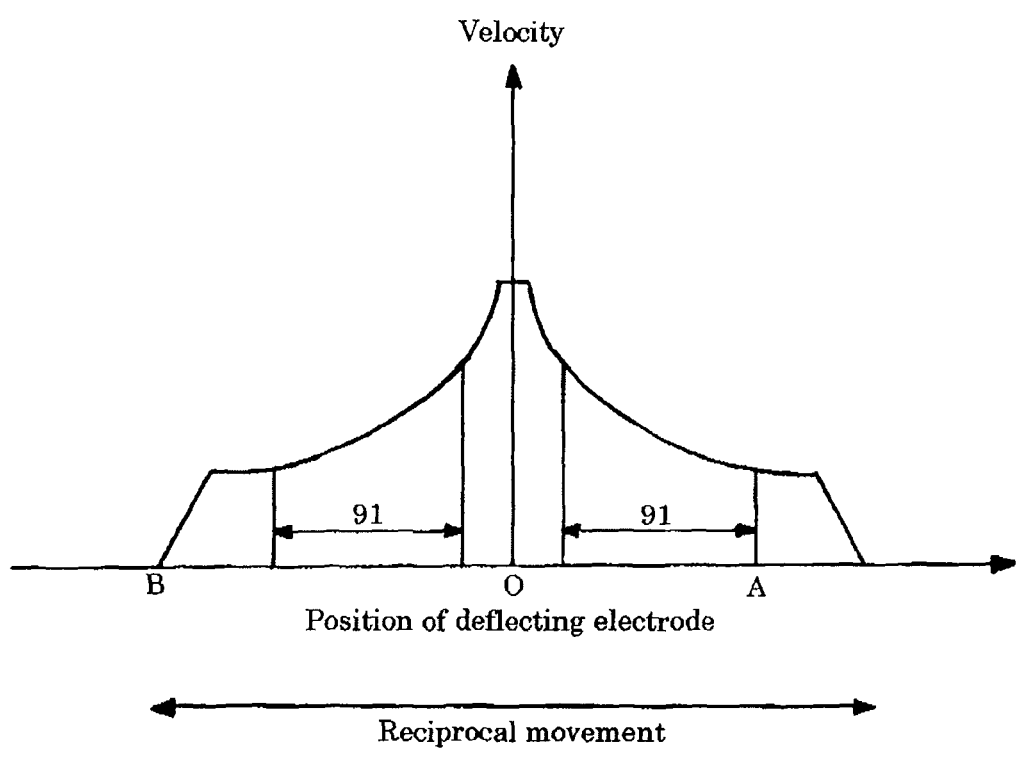
FIG. 9 is a view showing a relationship between the position and the velocity of the deflecting electrode when the deflecting electrode is moved reciprocally.

FIG. 9 is a view illustrating a moving velocity of the deflecting electrode 30 when the deflecting electrode 30 is reciprocally moved between the position A and the position B. It is controlled such that the moving velocity of the deflecting electrode 30 is relatively increased at the position O and relatively decreased at the positions A and B. Thus, the sweep velocity is modulated in conformity with the radius of an irradiation portion, so that the incident amount of ions to the to-be-processed substrate W can be made uniform. For example, the incident amount of ions upon the to-be-processed substrate W can be made uniform by modulating the sweep velocity to the operation of the deflecting electrode 30 so as to become inversely proportional to the radius of the corresponding to-be-processed substrate W. In the drawing, 91 indicates a range of irradiating the substrate.

In the above embodiment, the flat portion 75 of the lead-out electrode 7 is a non-irradiated portion, which is not irradiated with the ion beam, but the present invention is not limited to the above, and the grid portion may be formed so that the ion beam can be irradiated. Thus, the to-be-processed substrate W can be irradiated with a vertical ion beam and an oblique ion beam at the same time.

Referring to FIG. 1, the action of the substrate processing apparatus 100 of this embodiment is described below.

One to-be-processed surface of the substrate W is processed by irradiating the ion beam from the first ion beam generator 1a to it. Similarly, the other to-be-processed surface of the substrate W is processed by irradiating the ion beam from the second ion beam generator 1b to it.

In the substrate processing apparatus 100 of this embodiment, the first and second ion beam generators 1a and 1b each are configured to have the lead-out electrode 7, which has the grid portion 74 for emitting ions to the region outside of the contour of the to-be-processed substrate W. In addition, a deflecting electrode (not shown), which deflects the ion beam, which is lead out from the grid portion 74, toward the to-be-processed substrate W, is configured to be obliquely at a prescribed angle. Thus, the ions can enter obliquely the to-be-processed substrate W at the prescribed incident angle to perform the prescribed processing.

The effect of processing the substrate by the ion beam generator of the present invention is described below.

Examples of processing the substrate by entering the ion beam include fabrication of a film deposited on the substrate into a prescribed shape, fabrication of the whole surface, planarization processing upon the uneven surface formed on the substrate, etc.

FIG. 10A to FIG. 10D show an example of microfabrication of a film deposited on the substrate into a prescribed shape by entering the ion beam. A photoresist 202 is formed in a prescribed shape by lithography on a to-be-processed film 201, which was deposited on the to-be-processed substrate W by a sputtering method or a CVD method. Using it as a mask, an ion beam 203 is irradiated from the ion beam generator to fabricate the to-be-processed film 201. For the use requiring the microfabrication, such as the fabrication of the semiconductor substrate, fabrication according to a designed pattern, namely, vertical processing more accurately conforming to the mask, is desired in order to secure the device performance.

Figure 10A:
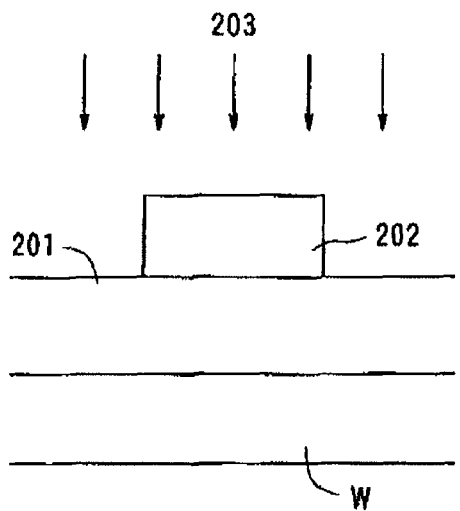
FIG. 10A to FIG. 10D are schematic sectional views illustrating effects of fine etching using the ion beam generator of the present invention.
Figure 10C:
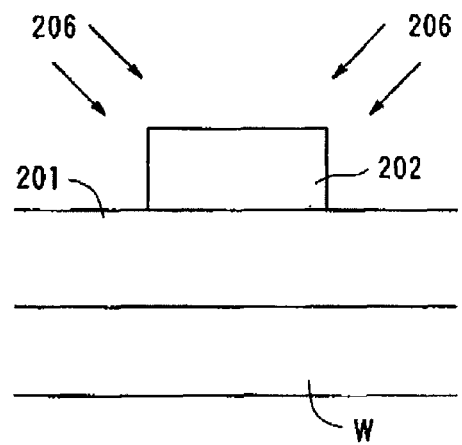
Figure 10B:
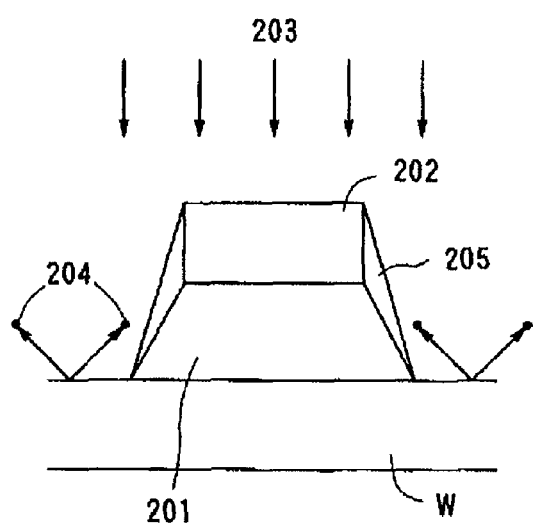
Figure 10D:
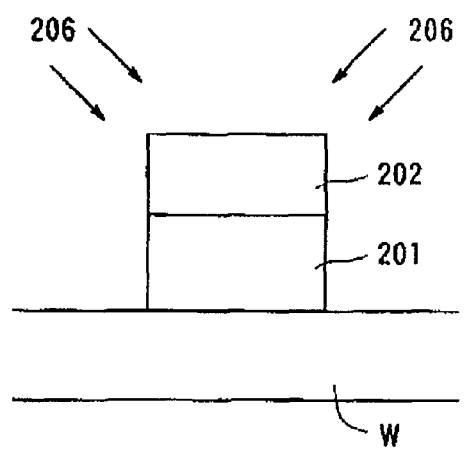

At this time, the ion beam generator accelerates the ions, which are generated by introducing a prescribed gas into the plasma source, by the lead-out electrode and irradiates the substrate with the ion beam to perform etching. FIG. 10A and FIG. 10B show fabrication shapes when the ion beam is entered from a vertical direction only, and FIG. 10C and FIG. 10D show that the ion beams are emitted obliquely by the apparatus of the present invention. At this time, when an inert gas, such as Ar or He is used, or when the to-be-processed material is a so-called hard-to-dry etch material and a volatile product is not formed by a chemical reaction between the to-be-processed material and the activated species generated by plasma, adhesive particles 204 are scattered from the processed surface of the substrate by sputtering. According to, for example, common sputtering theory, the particles are scattered in a certain distribution, which is proportional to a cosine of a discharge angle, so that they are partly scattered toward the side faces of the fabricated body to adhere thereto, to disturb the vertical progress of etching and to form a pattern side face deposited film 205. Because of the deposited film 205, the pattern side wall has a tapered shape, as shown in FIG. 10B. When etching is actually performed by such vertical incidence, a taper angle of about 75 degrees or more cannot be obtained. When the beam enters the tapered side wall at an ion incident angle of zero degrees with respect to the substrate, the ion incident angle to the side wall surface becomes very large. For example, according to FIG. 2 of a reference "R. E. Lee: J. Vac. Sci. Technol., 16, 164 (1979)", when the taper angle is seventy-five degrees as described above, the etching velocity to a to-be-etched surface parallel to the substrate lowers extremely. It is to be understood that the taper angle is an angle formed between the side wall and the substrate surface, and the ion incident angle is an angle at which the incidence ion beam is inclined from a direction perpendicular to the incident surface. For example, it is zero degree when the ion beam enters vertically to the to-be-etched surface.

On the other hand, when the ion beam generator 1 according to the present invention is used to irradiate an inclined ion beam 206 at an inclined angle of, for example, fifteen degrees, the ion beam has an incident angle of, for example, sixty degrees to the side face having a taper angle of seventy-five degrees and an incident angle of fifteen degrees to the to-be-etched surface. According to the above reference, the difference in etching velocity lowers considerably in comparison with the case that the ion beam is not inclined. As shown in FIG. 10D, the side wall of the to-be-processed film 201 is etched progressively, and a more vertical etched side surface can be obtained.

Figure 11A:
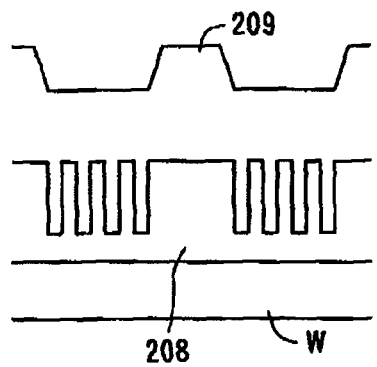
FIG. 11A to FIG. 11F are schematic sectional views illustrating effects of planarization etching using the ion beam generator of the present invention.
Figure 11D:
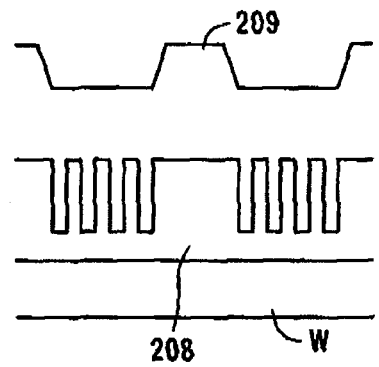

FIG. 11A to FIG. 11F show fabrication examples of planarizing the uneven surface of the substrate by the ion beam generator of the present invention. As shown in FIG. 11A and FIG. 11D, a to-be-processed layer 208 is previously formed on the to-be-processed substrate W, and then, microfabrication processing is performed by etching processing, or the like, according to a lithographic method. The etching processing is performed by the incident ion beam shown in, for example, FIG. 10C and FIG. 10D. An embedded layer 209 is formed on the etched layer 208 by performing embedding film formation on it by, for example, a sputtering method. When the film formation is performed by sputtering, or the like, a level difference occurs between portions with and without a pattern on the surface of the embedded layer 209, as shown in FIG. 11A and FIG. 11D. It is because sputtering particles enter uniformly to the substrate surface, and volumes of the films formed on individual portions on the substrate are equal. In some semiconductor fabrication and magnetic disk fabrication, it is desired that such an uneven surface is planarized for assuring the device performance and convenience of the subsequent process.

Figure 11B:
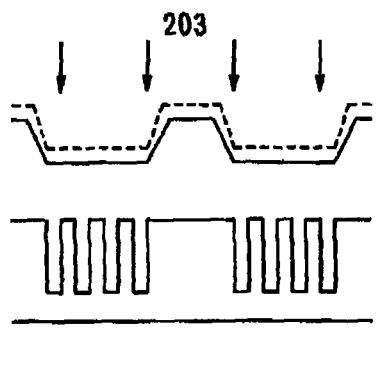
Figure 11E:
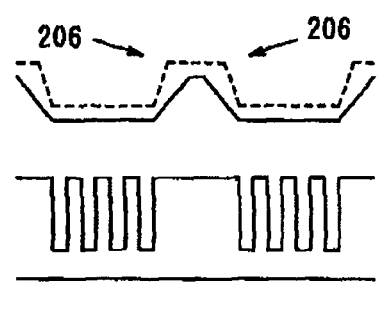
Figure 11C:
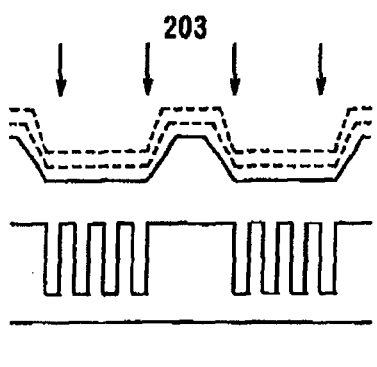

FIG. 11B and FIG. 11C show changes in surface shape when the ion beam 203 vertically enters the uneven surface. In this case, the surface parallel to the substrate W is fabricated uniformly, but since a taper portion has a very large incident angle of the ion beam, there is shown a shape that the progress of etching is suppressed. Since the ion beam has an effect of selectively etching the corners of protruded portions, the protruded portions are rounded, but a sufficient planarization effect cannot be obtained.

Figure 11F:
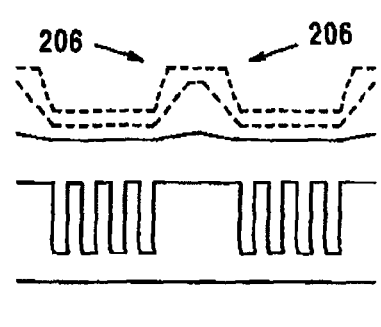

Meanwhile, when the ion beam 206 enters substantially vertically to the stepped side wall surface, namely, in an inclined form with respect to the substrate surface, as shown in FIG. 11E and FIG. 11F, the stepped side wall can be etched at a very fast etching velocity in comparison with that on the surface parallel to the substrate. Thus, only the width of the protruded portions is narrowed gradually, to eliminate the protruded portions, finally, and the flat portion can be obtained. For example, when the side wall of the level difference has a taper of seventy-five degrees, the ion beam 206 enters at an angle of sixty degrees, and the ion beam is irradiated to the stepped surface at the incident angle of fifteen degrees. At this time, the incident angle of the ion beam to the surface parallel to the substrate W becomes sixty degrees, and the stepped surface is etched at a considerably fast etching velocity according to the above-described reference.

Since the present invention can enter the uniform ion beam to the substrate, it is not necessary to rotate the substrate. According to the present invention, the provision of a substrate rotation mechanism is not preferable, because there is generated a portion where the entry of the ion beam is disturbed, because of its mechanism, or it is necessary to dispose sliding parts at the outer peripheral portion of the substrate, as shown in FIG. 5 of published Japanese Patent Application No. JP-A 2008-117753. Especially, the provision of the sliding parts at the outer peripheral portion of the substrate is not desirable, because it causes the unnecessary particles to adhere onto the substrate, and the yield is considerably disturbed. In addition, although it is not shown in the drawing, a very large mechanism is required to rotate the substrate without disturbing the ion beam and without providing the substrate portion with a sliding portion. Therefore, it is not suitable for the substrate processing apparatus, which is desired to be small, as in the present invention.

As described above, according to the substrate processing apparatus 100 of this embodiment, the grid portions 74 for outputting the ion beams of the mutually opposed ion beam generators 1a and 1b are formed outside of the to-be-processed substrate W. And, the ion beam is deflected by the deflecting electrode 30 for deflecting it toward the to-be-processed substrate and irradiated to the to-be-processed substrate. Thus, a compact ion beam generator, capable of emitting a uniform inclined ion beam to perform etching processing with a higher pattern accuracy and planarization of the uneven surface with the generation of particles suppressed, can be configured.

The ion beam generator of the present invention is preferably applied when the microfabrication or planarization is performed by etching the substrate surface in the production process of the electronic device, as described above.

Figure 12:
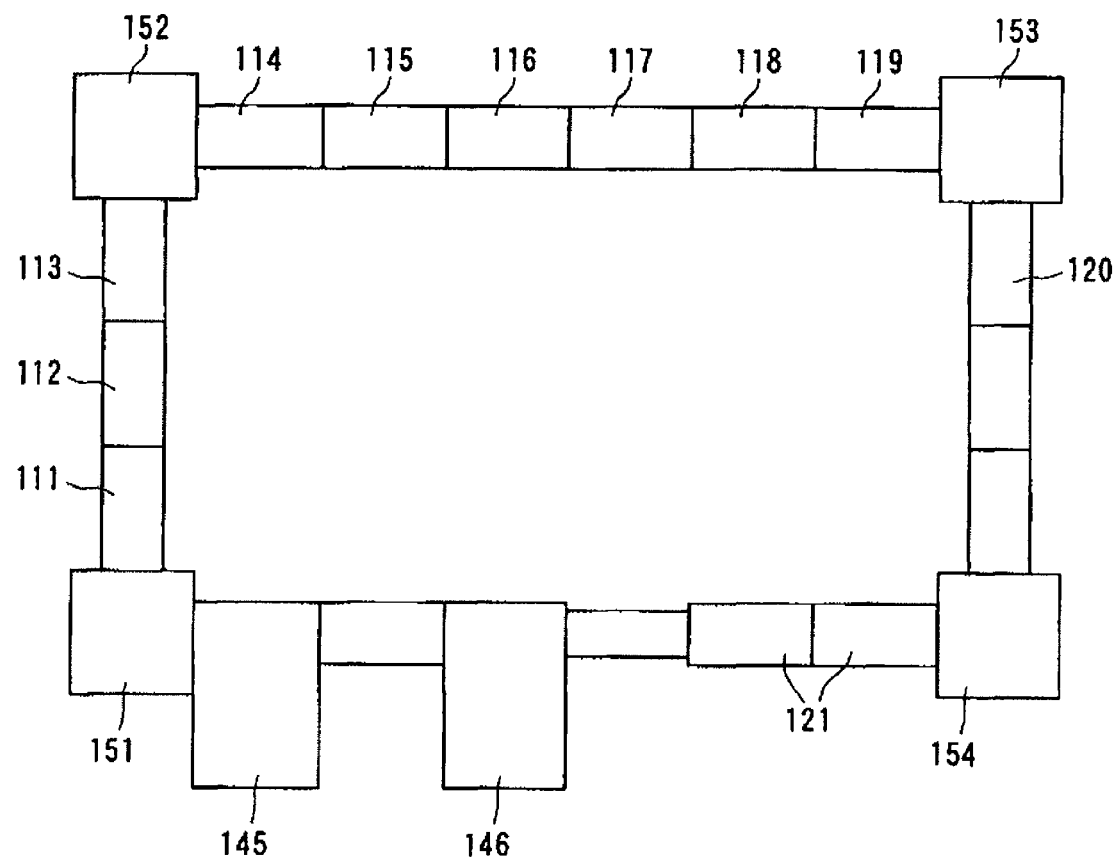
FIG. 12 is a block diagram showing a device for discrete track media fabrication and film forming as one example of the substrate processing apparatus of the present invention.

FIG. 12 is a view of a schematic structure of a production apparatus when the ion beam generator of the present invention is used for production of a magnetic recording medium. The production apparatus of this embodiment is an inline type production apparatus that has multiple evacuatable chambers 111 to 121 arranged in a connected form in an endless square form, as shown in FIG. 12. And, a conveying path for conveying the substrate to the adjacent vacuum chamber is formed within the individual chambers 111 to 121, and the substrate is processed in the individual vacuum chambers sequentially, while circulating through the production apparatus. And, the conveying direction of the substrate is changed in direction changing chambers 151 to 154, in which the conveying direction of the substrate, which is linearly conveyed between the chambers is turned by ninety degrees, and the substrate is sent to the next chamber. The substrate is introduced into the production apparatus by a load lock chamber 145, and after the processing is completed, the substrate is conveyed out of the production apparatus by an unload lock chamber 146. Plural chambers, such as the chambers 121, capable of performing the same processing may be disposed successively, to perform the same processing multiple times. Thus, a time taking processing can also be performed without extending the time taken. The apparatus of FIG. 12 has only the chambers 121 disposed in plural, but another chamber may also be disposed in plural.

Figure 13A:
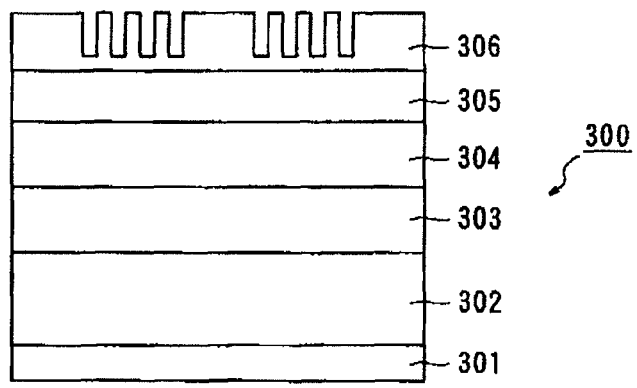
FIG. 13A to FIG. 13D are schematic sectional views illustrating a discrete track media fabricating and a film forming process flow using the apparatus of FIG. 12.

FIG. 13A is a schematic view of a laminated body that is processed by the production apparatus according to this embodiment. In this embodiment, the laminated body is formed on both sides of a substrate 301. But, for simplification of the drawing and description, the processing of the laminated body formed on one side of the substrate 301 is focused in FIG. 13A, and the laminated body formed on the other side and the processing on it are omitted. Therefore, the processing on the laminated body formed on one side of the substrate 301 is described referring to FIG. 13B to FIG. 13D and FIG. 14A to FIG. 14D, but the laminated body formed on the other side is also processed in the same manner.

As shown in FIG. 13A, the laminated body is under processing into a DTM (Discrete Track Media) and comprises the substrate 301, a soft magnetic layer 302, a base layer 303, a recording magnetic layer 304, a mask 305, and a resist layer 306. The laminated body is introduced into the production apparatus shown in FIG. 12. As the substrate 301, for example, a glass substrate or an aluminum substrate having a diameter of 2.5 inch (65 mm) can be used. The soft magnetic layer 302, the base layer 303, the recording magnetic layer 304, the mask 305, and the resist layer 306 are formed on both of the opposite sides of the substrate 301, but the laminated body formed on one side of the substrate 301 is omitted for simplification of the drawing, and a description, as described above.

The soft magnetic layer 302 is a layer that plays a part as a yoke of the recording magnetic layer 304 and contains a soft magnetic material, such as an Fe alloy or a Co alloy. The base layer 303 is a layer for a vertical orientation (laminated direction of the laminated body 300) of the easy axis of the recording magnetic layer 304, and contains a laminated body of Ru and Ta, or the like. The recording magnetic layer 304 is a layer that is magnetized in a vertical direction relative to the substrate 301 and contains a Co alloy, or the like.

The mask 305 is used to form grooves in the recording magnetic layer 304, and a diamond like carbon (DLC), or the like, can be used. The resist layer 306 is a layer for transcribing a groove pattern on the recording magnetic layer 304. In this embodiment, the groove pattern is transcribed on the resist layer by a nanoimprint method, and the laminated body 300 in the above state is introduced into the production apparatus shown in FIG. 12. The groove pattern may also be transcribed by exposing and developing, without depending on the nanoimprint method.

Figure 13B:
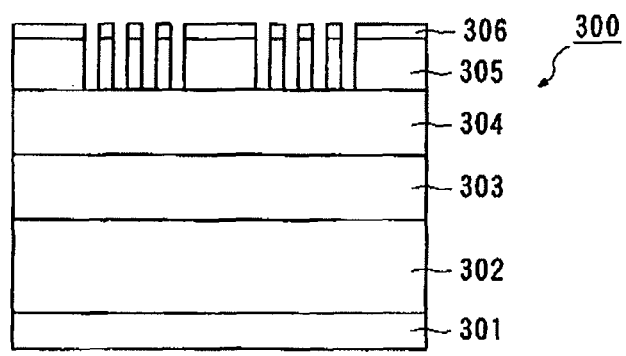
Figure 13C:
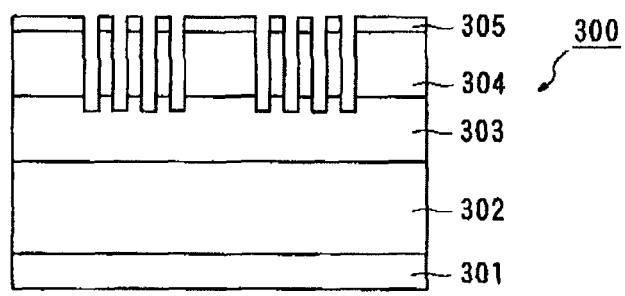

The production apparatus shown in FIG. 12 removes the grooves from the resist layer 306 by reactive ion etching in the first chamber 111, and then removes the mask 305, which is exposed in the grooves, in the second chamber 112, by the reactive ion etching. The cross section of the laminated body 300 at this time is shown in FIG. 13B. Subsequently, the recording magnetic layer 304 exposed in the grooves is removed by ion beam etching in the third chamber 113, and the recording magnetic layer 304 is formed as a concave-convex pattern having individual tracks separated in the radial direction as shown in FIG. 13C. At this time, for example, a pitch (groove width+track width) is 70 to 100 nm, the groove width is 20 to 50 nm, and the recording magnetic layer 304 has a thickness of 4 to 20 nm. The ion beam processing by the ion beam generator of the present invention can be performed in the third chamber 113, to effect etching processing at high pattern accuracy and excellent uniformity within the substrate.

Thus, the process of forming the recording magnetic layer 304 in the concave-convex pattern is performed. Then, the mask 305 remaining on the surface of the recording magnetic layer 304 is removed by reactive ion etching in the fourth chamber 114 and the fifth chamber 115. As a result, the recording magnetic layer 304 has an exposed state, as shown in FIG. 13D.

A process of filling an embedded layer 309 of a nonmagnetic material in the recessed portions of the recording magnetic layer 304 by forming as a film, and an etching process of removing the excessive portion of the embedded layer by etching are described below with reference to FIG. 14A to FIG. 14D.

Figure 13D:
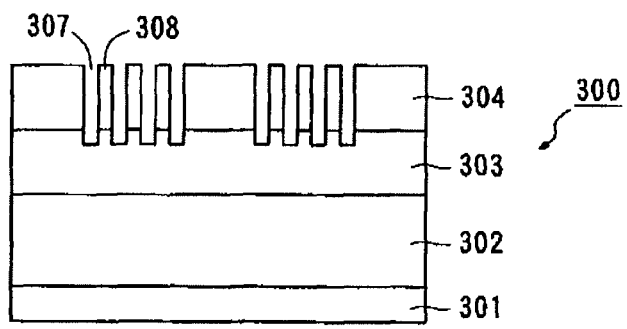
Figure 14A:
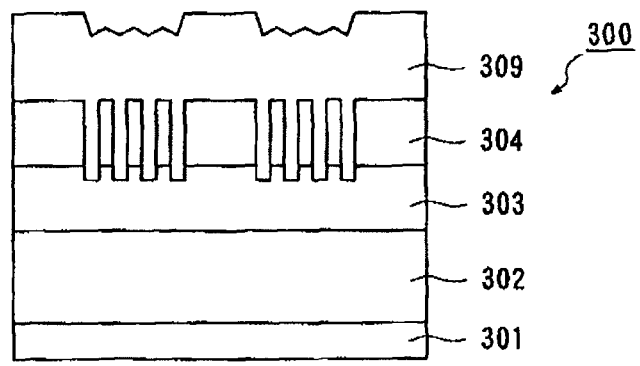
FIG. 14A to FIG. 14D are schematic sectional views illustrating a discrete track media fabricating and a film forming process flow using the apparatus of FIG. 12.

After the recording magnetic layer 304 of the laminated body 300 is exposed, as shown in FIG. 13D, the embedded layer 309 is formed on the surface of grooves 307, which are recessed portions of the recording magnetic layer 304 in the embedded layer forming chamber 117, as shown in FIG. 14A. The embedded layer forming chamber 117 functions as a second film forming chamber for forming and filling the embedded layer 309 of a nonmagnetic material on the recording magnetic layer 304. The embedded layer 309 is made of a nonmagnetic material that does not affect recording to and reading from the recording magnetic layer 304, and, for example, Cr, Ti, and their alloy (e.g., CrTi) can be used. The nonmagnetic material is adequate, even if it contains a ferromagnetic material, provided that the property as the ferromagnetic material, as a whole, is lost by containing another diamagnetic material or nonmagnetic material.

The method of forming the embedded layer 309 is not particularly limited, but a bias voltage is applied to the laminated body 300 to perform RF-sputtering in this embodiment. Thus, the application of the bias voltage leads the sputtered particles into the grooves 307 and prevents the generation of voids. As the bias voltage, for example, a DC voltage, an AC voltage, or a DC pulse voltage can be applied. The pressure condition is not particularly limited, but an embedding property is good under a condition with a relatively high pressure of 3 to 10 Pa, for example. And, by performing RF-sputtering with a high ionization rate, protruded portions 308, on which an embedding material is easily laminated in comparison with the grooves 307, can be etched by the ionized discharge gas simultaneously when the film is formed. Therefore, a difference in thickness of the film laminated on the grooves 307 and the protruded portions 308 can be suppressed. The embedding material may be laminated on the grooves 307 as the recessed portions by collimated sputtering or low-pressure remote sputtering, but the distance between the substrate 301 and the target can be decreased, and the apparatus can be made compact by the method of this embodiment.

Although it is not shown in the drawing, an etching stop layer may be formed before the embedded layer 309 is formed. For the etching stop layer, a material having an etching velocity lower than that of the embedded layer 309, under the condition of planarization described later for the embedded layer 309, as the upper layer, may be selected. Thus, there can be provided a function of suppressing damage to the recording magnetic layer 304 due to excessive progress of etching at the time of planarization. And, when a nonmagnetic metallic material is selected as the etching stop layer, the bias voltage at the time of forming the embedded layer 309 in the post-process can be functioned effectively, and the generation of voids can be suppressed effectively.

FIG. 12 also shows the etching stop layer forming chamber 116.

The surface after forming the embedded layer 309 is lower than the flat surface described above, although fine projections and recesses are mostly filled, as shown in FIG. 14A. When the embedded layer does not have a sufficient thickness on the fine projections and recesses, fine projections and recesses might be left.

Figure 14B:
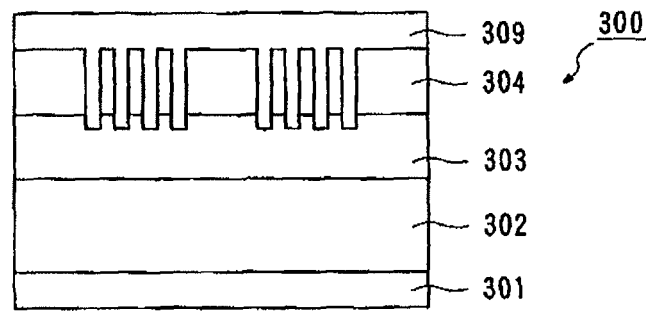

Then, in the first etching chamber 118, the embedded layer 309 is removed, as shown in FIG. 14B, but the embedded layer 309 is somewhat left on the recording magnetic layer 304. In this embodiment, the embedded layer 309 is removed by ion beam etching using an inert gas, such as an Ar gas as an ion source. At this time, the inclined ion beam is irradiated by the ion beam generator of the present invention to perform effective planarization of the level difference formed on the surface. The inclined angle of the ion beam may be single or a combination of multiple angles, or may also include vertical incidence, and the shape of the deflecting electrode 30 and the voltage applied to the deflecting electrode 30 can be selected depending on the level difference of the surface for optimization.

The first etching chamber 118 is provided with the ion beam generators 1a and 1b of the present invention exemplified in FIG. 1. The first etching chamber 118 is a chamber for partly removing the embedded layer 309 by ion beam etching. For example, specific etching conditions include that a chamber pressure is $1.0 \times 10^{-1}$ Pa or less, an electrode 73 has a voltage of +500V or more, an electrode 72 has a voltage of −500V to −2000V, and RF power for inductively coupled plasma (ICP) discharge is about 200 W.

Figure 14C:
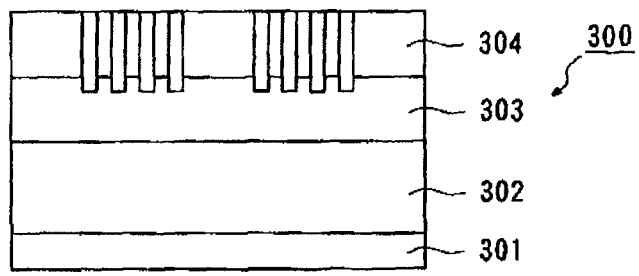

After the planarization, the ion beam etching is continued to remove completely the left embedded layer 309, as shown in FIG. 14C.

FIG. 12 also shows the second etching chamber 119 for removing the above-described etching stop layer, not shown. The etching chamber 119 is comprised of a mechanism to apply bias, such as DC, RF or DC pulse to the carrier by ICP plasma using a reactive gas.

Figure 14D:
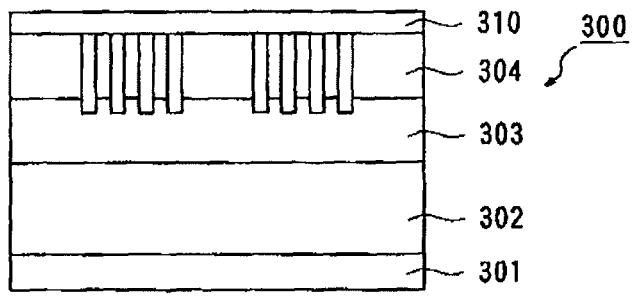

As shown in FIG. 14D, a DLC layer 310 is then formed on the planarized surface. In this embodiment, the DLC layer 310 is formed in the protective film forming chamber 121 after adjusting to a temperature required for DLC formation in the heating chamber 120 or a cooling chamber. For example, the film forming conditions for a parallel plate CVD include that high frequency power is 2000 W, pulse-DC bias is −250V, a substrate temperature is 150 to 200 degrees C., a chamber pressure is about 3.0 Pa, gas is $C_2H_4$, and a flow rate is 250 sccm. ICP-CVD, or the like, may also be used.

Although the embodiments of the present invention have been described above, the present invention is not limited to the above embodiments.

For example, when the mask 305 is carbon, there may be adopted a method of leaving the mask 305 instead of forming the etching stop layer. But, it has a possibility of causing the mask 305 to have an uneven thickness, because of two times of etching, such as etching for removal of the resist layer 306 and etching for removal of the excessive embedded layer 309. Therefore, it is preferable that the mask 305 is removed as in the above embodiment, and the etching stop layer is formed. And, the etching stop layer can also be formed on the bottoms and side walls of the grooves 307, and when a conductive material is used for the etching stop layer, it is preferable, because it becomes easy to apply a bias voltage, as described above.

The DTM has been described above, but it is not exclusively limited. For example, the present invention can also be applied when the embedded layer 309 is formed on the concave-convex pattern of BPM having the recording magnetic layer 304 in a dotted form.

The present invention is not limited to the exemplified substrate processing apparatus (magnetron sputtering apparatus), but can also be applied to a plasma processing apparatus, such as a dry etching apparatus, a plasma asher apparatus, a CVD apparatus, and a liquid crystal display production apparatus.

The substrate processing apparatus of the present invention can also be configured by combining the characteristics described in the individual embodiments.

As an electronic device that can use the ion beam generator of the present invention for its production, there are semiconductors, magnetic recording media, and the like.

The invention claimed is:

1. An ion beam generator comprising:
a discharge tank for generating plasma that includes ions;
a lead-out electrode, having an annular grid portion provided with openings for leading out the ions generated in the discharge tank, while accelerating the generated ions as an annular ion beam, which is led out of the lead-out electrode; and
a deflecting electrode for deflecting the annular ion beam, led out of the lead-out electrode, in an annular center direction, the deflecting electrode comprising a first electrode tube and a second electrode tube, the first electrode tube and the second electrode tube being in a circular truncated cone shape having respective openings in an upper surface portion and a bottom surface portion thereof, a diameter of an opening of the second electrode tube being smaller than a diameter of an opening of the first electrode tube, wherein the ion beam led out from the lead-out electrode enters the deflecting electrode between the first electrode tube and the second electrode tube, and is deflected.

2. The ion beam generator according to claim 1, wherein the annular grid portion of the lead-out electrode is a grid portion having one of a substantially circular ring shape and a substantially regular polygonal shape.

3. The ion beam generator according to claim 1, further comprising a drive mechanism for moving the deflecting electrode in a direction to face the lead-out electrode.

4. The ion beam generator according to claim 3, wherein the drive mechanism moves the deflecting electrode reciprocally.

5. The ion beam generator according to claim 1, wherein the openings of the annular grid portion are linear holes.

6. An ion beam etching apparatus comprising:
a neutralizer for irradiating electrons;
a substrate holder for holding a substrate; and
an ion beam generator disposed to face the substrate held by the substrate holder,
wherein the ion beam generator is one according to any one of claims 1 to 5.

7. The ion beam etching apparatus according to claim 6, wherein, in the ion beam generator, the grid is arranged parallel to the substrate held by the substrate holder, and the deflecting electrode deflects the ion beam led out by the grid portion, so that the ion beam is caused to enter the substrate held by the substrate holder at an angle that is inclined relative to the substrate.

* * * * *